United States Patent [19]

Shiga

[11] Patent Number: 5,396,132
[45] Date of Patent: Mar. 7, 1995

[54] MESFET MIXER CIRCUIT HAVING A PULSE DOPED STRUCTURE

[75] Inventor: Nobuo Shiga, Yokohama, Japan

[73] Assignee: Sumitomo Electric Industries, Ltd., Japan

[21] Appl. No.: 24,751

[22] Filed: Mar. 2, 1993

[30] Foreign Application Priority Data

Mar. 11, 1992 [JP] Japan .................. 4-052425

[51] Int. Cl.$^6$ .............................. H03D 7/12
[52] U.S. Cl. .................. 327/113; 257/269; 257/279; 257/270; 327/431; 327/581
[58] Field of Search ............. 307/529, 261, 304, 254; 257/254, 269, 279, 270, 280, 285; 328/104, 156, 14, 15

[56] References Cited

U.S. PATENT DOCUMENTS

| 4,308,473 | 12/1981 | Carnes | 307/529 |
|---|---|---|---|
| 4,459,556 | 7/1984 | Nanbu et al. | 330/278 |
| 4,723,113 | 2/1988 | Marcoux | 331/76 |
| 4,751,744 | 6/1988 | Pavio, Jr. | 455/333 |
| 4,814,649 | 3/1989 | Young | 307/529 |
| 4,845,389 | 7/1989 | Pyndiah et al. | 307/529 |
| 5,039,891 | 8/1991 | Wen et al. | 307/529 |
| 5,070,376 | 12/1991 | Shiga | 357/22 |
| 5,083,050 | 1/1992 | Vasile | 307/529 |
| 5,091,759 | 2/1992 | Shih et al. | 357/22 |

FOREIGN PATENT DOCUMENTS 2587154  3/1987  France .
62-72210  2/1987  Japan .................. 455/333

OTHER PUBLICATIONS

C. Buttschardt, "A Converter for VHF FM", *QST Amateur Radio*, vol. 52, No. 12, pp. 18–19, Newington, U.S. (1968).

D. Demaw, "A Low-Noise Converter For 144 MC", *QST Amateur Radio*, vol. 51, No. 9, pp. 11–12, Newington, U.S. (1967).

*Primary Examiner*—Timothy P. Callahan
*Assistant Examiner*—My-Trang Nu Ton
*Attorney, Agent, or Firm*—Beveridge, DeGrandi, Weilacher & Young

[57] ABSTRACT

An FET mixer circuit having a stable input impedance uses two tandem-connected GaAs MESFET's (1) and (2) of pulse doped structure instead of a conventional MESFET or a HEMT, as an active device. A gate biasing point for the FET (1) is set around a pinch-off point of a mutual conductance, and a gate biasing point for the FET (2) is set in a region which assures non-change of a mutual conductance with respect to the increase of a gate voltage. Thus, a mixer circuit having a good isolation characteristic for an RF signal and a local oscillation signal and exhibits substantially no change in the input impedance is attained.

7 Claims, 2 Drawing Sheets

MESFET MIXER CIRCUIT HAVING A PULSE DOPED STRUCTURE

BACKGROUND OF THE INVENTION

1. Field of the Invention

The present invention relates to a mixer circuit to be used for a frequency converter circuit or a measuring instrument.

2. Related Background Art

As information network systems develop rapidly, the demand for a satellite communication systems has also rapidly increased and the frequency bands used are shifting toward a high frequency region. In such a satellite communication system, a down-converter for converting a high frequency signal to a low frequency signal is required, and demand for a mixer circuit used therefor is also increasing. A conventional mixer circuit uses a diode, a bipolar transistor or a field effect transistor (FET) as an active device. When an FET, a conventional Schottkey gate FET (MESFET) or a high electron mobility transistor (HEMT) is usually used.

A biggest problem in designing the mixer circuit using the FET or the FET mixer circuit is that the gate voltage of the FET significantly swings because a local oscillation signal is a large amplitude signal. The change in the gate voltage causes a change in the mutual conductance $g_m$ of the FET, which in turn causes a change in a gate-source capacitance $C_{gs}$ or an input impedance. When viewed from an RF signal input terminal, the FET mixer circuit operates with a large change in the input impedance of the circuit as a function of a time corresponding to the swing of the local oscillation signal. As a result, the design is hard to attain and a stable operation is not expected.

SUMMARY OF THE INVENTION

It is an object of the present invention to provide a mixer circuit in which an input impedance does not change and which operates stably.

In order to achieve the above object, the mixer circuit of the present invention comprises first and second FET's, and a gate electrode of the second FET is connected to an RF signal input terminal, a gate electrode of the first FET is connected to a local oscillation signal input terminal and a drain of the second FET, and a drain of the first FET is connected to an IF (intermediate frequency) signal output terminal. The first and second FET's are MESFET's having a pulse doped structure.

In accordance with the mixer circuit of the present invention, the input impedance of the circuit viewed from the RF signal input terminal is not affected because the local oscillation signal is not applied to the gate of the second FET to which the RF signal is applied. Further, where a gate biasing point of the second FET is set in a flat region of the mutual conductance by utilizing a characteristic inherent to the MESFET of the pulse doped structure, that is, "it has the flat region in which the mutual conductance does not change with the gate voltage," a change of the input impedance due to the RF signal itself does not occur. By making a gate width of the second FET shorter than that of the first FET arranged at the output, a power consumption can be reduced compared to a conventional circuit in which a single FET is used and the RF signal and the local oscillation signal are applied to the gate thereof and the IF signal is taken out of the drain thereof. Further, since the RF signal and the local oscillation signal are applied to the different FET's, an isolation characteristic between the FET's is superior to that attained when the active device comprises a single FET.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DETAILED DESCRIPTION OF THE PREFERRED EMBODIMENTS

Figure 1:
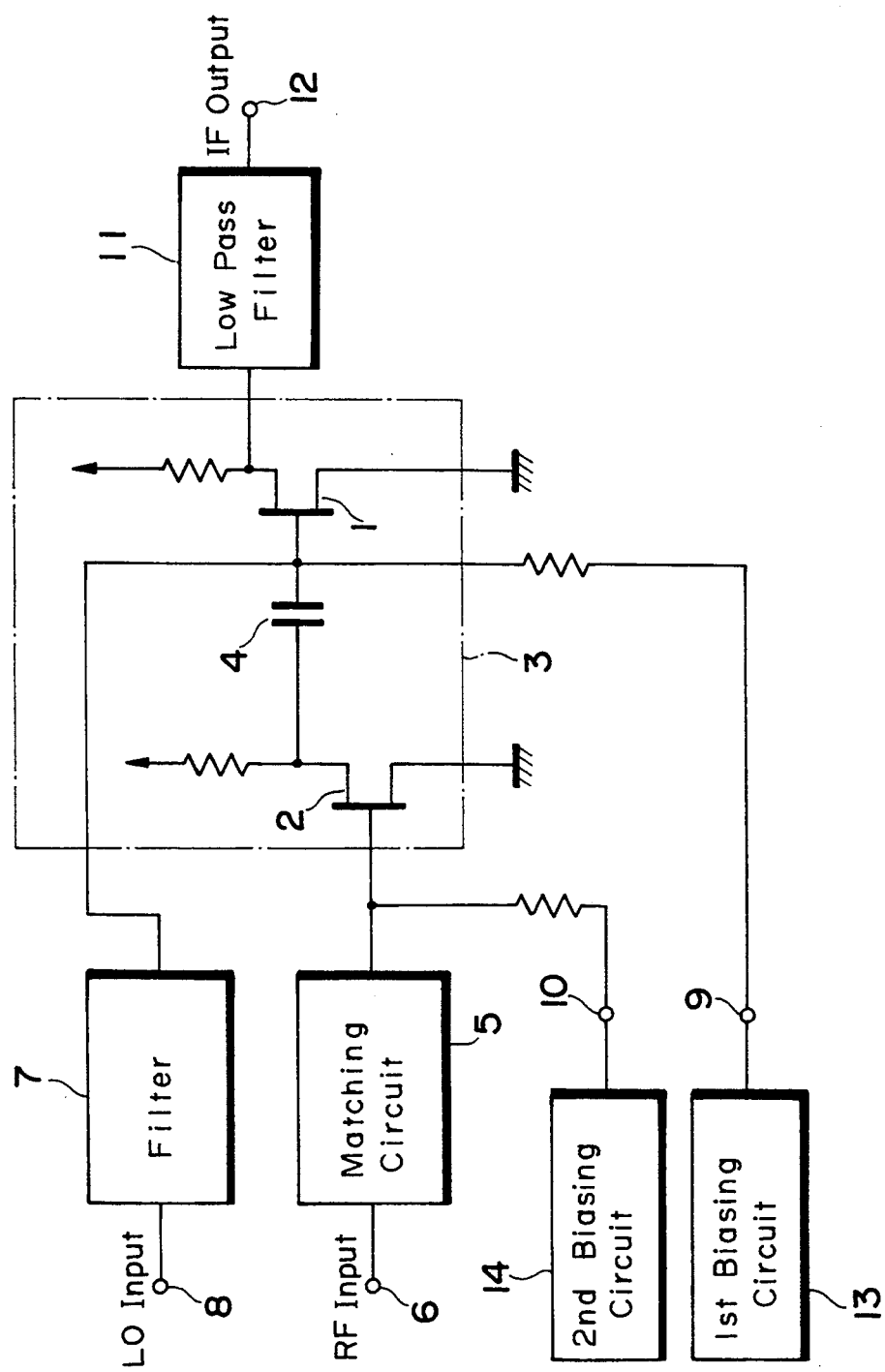
FIG. 1 shows a block diagram of a mixer circuit in accordance with one embodiment of the present invention.
Figure 2:
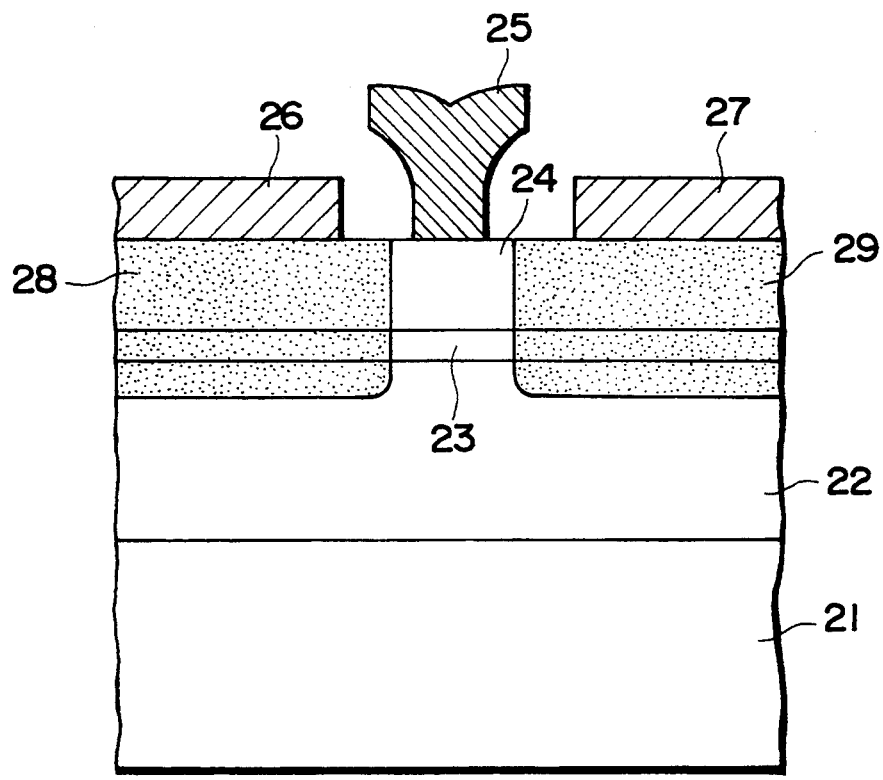
FIG. 2 shows a sectional view of a GaAs MESFET of pulse doped structure.

Referring to FIG. 1, two GaAs MESFETs 1 and 2 of pulse doped structure connected in tandem are used as an active device 3 of the mixer circuit. FIG. 2 shows a sectional view of a structure of the GaAs MESFET 1 or 2 of the pulse doped structure. An undoped p- GaAs buffer layer 22, an Si-doped pulse doped GaAs layer 23 which serves as an activation layer, and an undoped n- GaAs cap layer 24 are sequentially laminated on a semi-insulative GaAs substrate 21 by an epitaxial growth method, and n+ion implantation regions 28 and 29 which extend from a surface to a top of the buffer layer 22 are formed in a source region and a drain region. A gate electrode 25 which makes a Schottkey contact with the cap layer 24 is formed in a region on the cap layer 24 which is sandwiched by the source region and the drain region, and a source electrode 26 and a drain electrode 27 which make ohmic contacts with the cap layer 24, respectively, are formed in the Source region and the drain region. A gate length is 0.5 $\mu$m. An example of the thickness is that the buffer layer 22 is 10,000 Angstrom, the pulse doped layer 23 is 100 Angstrom, and the cap layer 24 is 300 Angstrom. An impurity concentration of the pulse doped layer 23 is $4.0 \times 10^{18}$ cm$^{-3}$. An organic metal vapor phase epitaxial growth (OMVPE) method is used as an epitaxial growth method. Specifically, a Cr-doped GaAs substrate is used and the vapor phase growth is carried out by introducing TMG (trimethyl gallium) and AsH$_3$ as source gas and SiH$_6$ as dopant at a pressure of 60 Torr and a temperature of 650° C. A source gas introduction V/III ratio is 6 for the buffer layer 22, 40 for the pulse doped layer 23 and 100 for the cap layer 24. The MESFET's 1 and 2 of the pulse doped structure have different gate widths. The gate width of the FET 1 is approximately 300 $\mu$m and the gate width of the FET 2 is approximately 50–100 $\mu$m.

An input terminal 6 of the RF (radio frequency) signal is connected to the gate of the MESFET 2 of the pulse doped structure through a matching circuit 5 for matching an input impedance. The drain of the FET 2 is connected to the gate of the FET 1 through a coupling capacitor 4 which couples AC circuits having different DC levels. Thus, an AC component of the signal output from the drain of the FET 2 is applied to the gate of the FET 1. An input terminal 8 of the local oscillation (LO) signal is connected to the gate of the FET 1 through a filter 7. As a result, the RF signal applied to the FET 1 through the FET 2 is combined with the LO signal and converted to a lower frequency (an intermediate frequency (IF)) signal.

An output terminal 12 is connected to the drain of the FET 1 through a low pass filter 11 which passes only the intermediate frequency (IF) signal which is the output signal. As a result, the IF signal which is a mixed-down signal of the RF signal is output from the output terminal 12. The filter 7 serves to prevent the IF signal generated by the mixer circuit from leaking to the local oscillation circuit connected to the terminal 8. The terminals 9 and 10 are input terminals for applying DC gate bias voltages to the FET 1 and the FET 2, respectively.

An output terminal of a first biasing circuit 13 which supplies a gate bias voltage around a pinch-off voltage to the gate electrode of the FET 1 is connected to the terminal 9. An output terminal of a second biasing circuit 14 which supplies a gate bias voltage to the gate electrode of the FET 2 and whose mutual conductance $g_m$ does not change with the gate voltage is connected to the terminal 10.

The significance of the magnitudes of the bias voltages supplied by the first and second biasing circuits 13 and 14 is explained below.

The mixer circuit of the present embodiment converts the frequency by utilizing the non-linearity of the mutual conductance as the prior art FET mixer circuit does. Accordingly, it is necessary for the FET I which carries out the mixing to operate at a gate biasing point which assures that the mutual conductance $g_m$ is non-linear to the gate voltage $V_g$. On the other hand, it is necessary for the FET 2 for which the stable input impedance is required to operate at a gate biasing point which assures that the mutual conductance $g_m$ is constant with respect to the gate voltage $V_g$.

Figure 3:
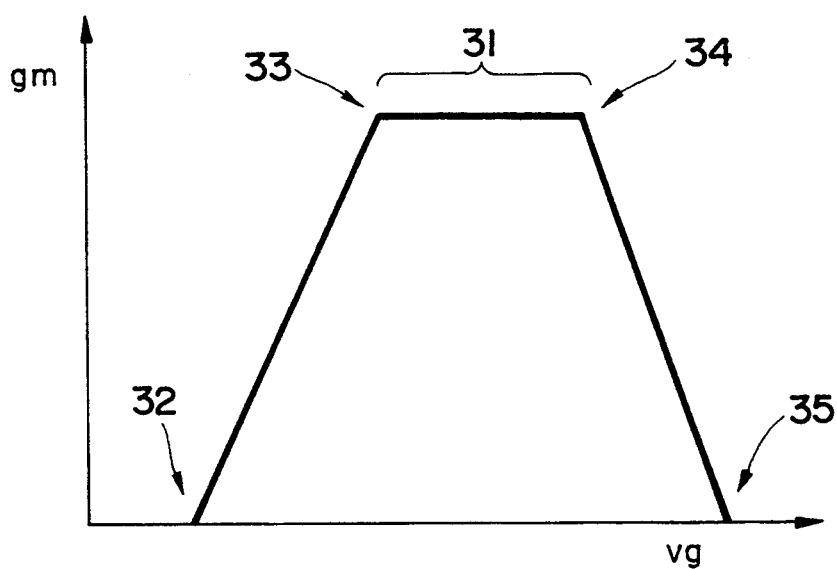
FIG. 3 shows a graph of gate voltage $V_g$ Versus mutual conductance $g_m$ of the GaAs MESFET of the pulse doped structure.

FIG. 3 shows a gate voltage $V_g$ versus mutual conductance $g_m$ characteristic of the GaAs MESFET's 1 and 2 of the pulse doped structure. Four points shown by numerals 32–35 may be candidates for the gate biasing point which assures the non-linear mutual conductance $g_m$ to the gate voltage $V_g$. Namely, a large conversion efficiency may be attained around those points. On the other hand, a flat region 31 is a candidate for the gate biasing point which assures that the input impedance does not significantly change with respect to the swing of the gate voltage. The flat region 31 in which the mutual conductance $g_m$ does not change with the gate voltage $V_g$ is a characteristic which is inherent to the MESFET of the pulse doped structure and not found in the prior art device. The non-change of the mutual conductance $g_m$ means a small change in the input capacitance or the gate-source capacitance $C_{gs}$, and the input impedance of the FET greatly depends on the gate-source capacitance $C_{gs}$. Accordingly, so long as the gate voltage $V_g$ changes in the flat region 31, there is no significant change in the input impedance.

The input impedance is generally expressed by the following formula, which indicates the great dependency of the input impedance to the gate-source capacitance $C_{gs}$.

$$Z_{in} = R_g + 1/j\omega C_{gs} + R_{in} + R_s$$

where $R_g$ is a gate resistance, $R_{in}$ is a channel resistance, and $R_s$ is a source resistance.

From the above consideration, the gate biasing point for the FET 1 is to be set around one of the four points 32–35, and it is preferable to set the gate biasing point around the point 32, that is, around the pinch-off point is order to minimize the power consumption. For the FET 2, it is preferable to set the gate biasing point in the flat region 31 in which the input impedance is stable with respect to the change in the gate voltage. It is also preferable to minimize the power consumption of the FET 2 like the FET 1. In consideration of the above, it is desirable to set the gate biasing point around the point 33 which is the lowest gate voltage point in the flat region 31.

In the mixer circuit of the present embodiment, the tandem connection of the first GaAs MESFET of the pulse doped structure and the second GaAs MESFET of the pulse doped structure having a shorter gate width than that of the first FET is used as the active device, the gate biasing point of the first FET is set around the pinch-off point of the mutual conductance, and the gate biasing point of the second FET is set in the region in which the mutual conductance does not change with the increase of the gate voltage. Accordingly, the isolation characteristic between the RF signal and the local oscillation signal is good, the input impedance does not substantially change and the power consumption is low.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A mixer circuit comprising:
   a first input terminal for receiving a local oscillation signal;
   a second input terminal for receiving an RF signal;
   a first GaAs MESFET having a gate electrode, a drain electrode, and a source electrode, said gate electrode being connected to said first input terminal;
   a second GaAs MESFET having a pulse doped structure, a gate electrode, a drain electrode, and a source electrode, said gate electrode being connected to said second input terminal, said drain electrode of said second MESFET being connected to said gate electrode of said first MESFET,
   a first bias voltage source connected to said gate electrode of said first MESFET;
   a second bias voltage source connected to said gate electrode of said second MESFET;
   an output terminal connected to said drain electrode of said first MESFET; wherein
   said second MESFET has a mutual conductance-gate voltage characteristic such that the mutual conductance of said second MESFET remains constant during a change in gate electrode voltage applied to said gate electrode of said second MESFET when a predetermined bias is applied by said second bias voltage source.

2. The mixer according to claim 1, wherein said pulse doped structure of said second MESFET has laminated epitaxial layers on a substrate, said layers comprising an upper, an intermediate and a lower epitaxial layer each being of a same material as said substrate, said intermediate layer having an impurity level greater than that of said upper and lower epitaxial layers.

3. A mixer circuit according to claim 1 wherein a gate width of said second GaAs MESFET is shorter than that of said first GaAs MESFET.

4. A mixer circuit according to claim 3 wherein an impedance matching circuit is provided between the gate electrode of said second GaAs MESFET and the RF signal input terminal.

5. A mixer circuit according to claim 4 wherein a coupling capacitor is provided between the drain electrode of said second GaAs MESFET and the gate electrode of said first GaAs MESFET.

6. A mixer circuit according to claim 5 wherein a low pass filter is provided between the drain electrode of said first GaAs MESFET and the IF signal output terminal.

7. A mixer circuit according to claim 6 wherein a filter is provided between the gate electrode of said first GaAs MESFET and the local oscillation signal input terminal to prevent the IF signal mixed down by the mixer circuit from leaking to the local oscillation signal input terminal.

* * * * *